US010177001B2

(12) United States Patent
Liu et al.

(10) Patent No.: US 10,177,001 B2
(45) Date of Patent: Jan. 8, 2019

(54) SURFACE MODIFYING MATERIAL FOR SEMICONDUCTOR DEVICE FABRICATION

(71) Applicant: Taiwan Semiconductor Manufacturing Co., Ltd., Hsin-Chu (TW)

(72) Inventors: Chen-Yu Liu, Kaohsiung (TW); Ching-Yu Chang, Yilang County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/169,162

(22) Filed: May 31, 2016

(65) Prior Publication Data

US 2017/0345648 A1     Nov. 30, 2017

(51) Int. Cl.
| H01L 21/306 | (2006.01) |
| H01L 21/027 | (2006.01) |
| H01L 21/3105 | (2006.01) |
| H01L 21/321 | (2006.01) |

(52) U.S. Cl.
CPC ........ *H01L 21/306* (2013.01); *H01L 21/0271* (2013.01); *H01L 21/3105* (2013.01); *H01L 21/321* (2013.01)

(58) Field of Classification Search
CPC .................................. H01L 21/306; G03F 7/16
USPC ........................................................ 430/270.1
See application file for complete search history.

(56) References Cited

U.S. PATENT DOCUMENTS

| 3,549,368 | A | | 12/1970 | Collins et al. | |
|---|---|---|---|---|---|
| 4,330,671 | A | * | 5/1982 | Pampalone | C08G 75/00 427/273 |
| 5,505,781 | A | * | 4/1996 | Omori | C23C 16/4412 118/715 |
| 6,361,921 | B1 | * | 3/2002 | Thompson | G03F 7/11 430/270.1 |
| 6,479,879 | B1 | | 11/2002 | Pike et al. | |
| 8,216,767 | B2 | | 7/2012 | Wang et al. | |
| 8,323,870 | B2 | | 12/2012 | Lee et al. | |
| 8,580,117 | B2 | | 11/2013 | Kao et al. | |
| 8,658,344 | B2 | | 2/2014 | Wang et al. | |
| 8,715,919 | B2 | | 5/2014 | Chang et al. | |
| 8,741,551 | B2 | | 6/2014 | Wu et al. | |
| 2002/0004216 | A1 | * | 1/2002 | Abbott | G01N 21/75 435/7.92 |
| 2003/0148401 | A1 | * | 8/2003 | Agrawal | B01J 19/0046 506/9 |
| 2008/0063976 | A1 | * | 3/2008 | Chang | G03F 7/0047 430/270.1 |
| 2009/0162800 | A1 | * | 6/2009 | Abdallah | G02B 1/111 430/326 |

(Continued)

OTHER PUBLICATIONS

Yeh W-M et al., "Application of Aziridine Reactive Rinses in a Post-Development Process to Reduce Photoresist Pattern Collapse", Proc. of SPIE vol. 8325, 7pgs.

*Primary Examiner* — Marcos D Pizarro
*Assistant Examiner* — Antonio Crite
(74) *Attorney, Agent, or Firm* — Haynes and Boone, LLP

(57) ABSTRACT

Methods and materials for making a semiconductor device are described. The method includes forming a surface preparation layer over the semiconductor substrate. The surface preparation material layer includes an aziridine structure. A coating layer may then be deposited on the surface preparation material layer.

20 Claims, 4 Drawing Sheets

(56) References Cited

U.S. PATENT DOCUMENTS

| | | | |
|---|---|---|---|
| 2010/0151381 A1* | 6/2010 | Tachibana | C09D 133/16 |
| | | | 430/270.1 |
| 2012/0088188 A1* | 4/2012 | Trefonas | B81C 1/00031 |
| | | | 430/270.1 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0210835 A1* | 7/2014 | Hong | H01L 29/78696 |
| | | | 345/530 |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0214226 A1* | 7/2015 | Su | H01L 27/0886 |
| | | | 257/401 |
| 2016/0147152 A1* | 5/2016 | Fujitani | G03F 7/11 |
| | | | 438/695 |

\* cited by examiner

SURFACE MODIFYING MATERIAL FOR SEMICONDUCTOR DEVICE FABRICATION

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods, tools, and materials have struggled to realize the desire for smaller feature sizes.

Lithography is a mechanism by which a pattern is projected onto a substrate, such as a semiconductor wafer, having a photosensitive layer formed thereon. The pattern is typically induced by passing radiation through a patterned photomask. Lithography tools and methods have experienced significant advances in decreasing the line width of an imaged element. This decreased line width also increases the challenges in providing a quality coating onto a patterned surface. Although existing methods including deposition of layers for photolithography and other processes have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in the drawing are not drawn to scale. In fact, the dimensions of illustrated features may be arbitrarily increased or decreased for clarity of discussion.

DETAILED DESCRIPTION

Figure 1:
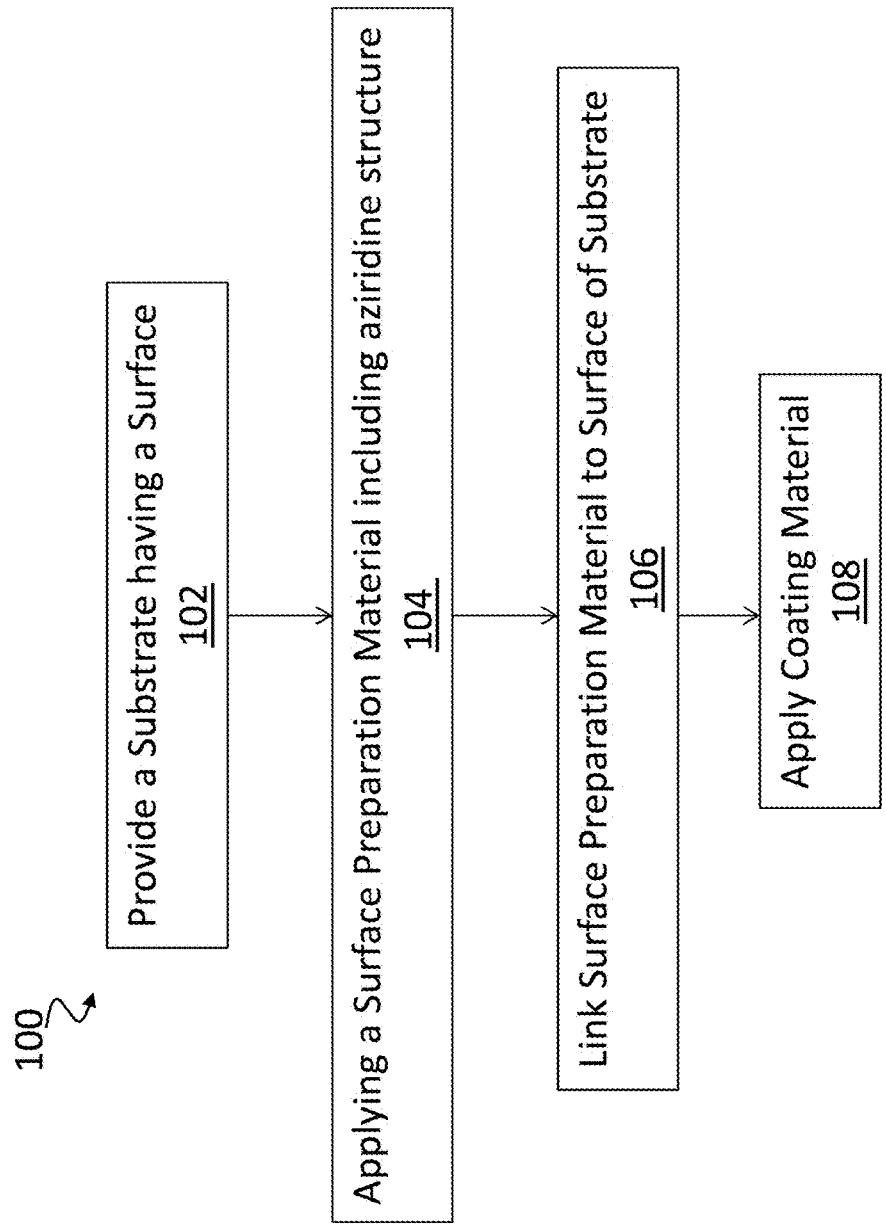
FIG. 1 is a flow chart showing an embodiment of a method of forming a coating over a substrate, according to one or more aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method for use in manufacturing a semiconductor device. The semiconductor device may include an integrated circuit (IC), a system on a chip (SOC) or portion thereof, and may include various active or passive microelectronic devices such as resistors, capacitors, inductors, diodes including light emitting diodes (LEDs), photocells, phototransistors, metal-oxide semiconductor field effect transistors (MOSFETs), complementary metal oxide semiconductor (CMOS) transistors, bipolar junction transistors (BJT), laterally diffused MOS (LDMOS) transistors, high power MOS transistors, other types of transistors, and/or other types of semiconductor devices. Certain embodiments are provided that describe methods for forming layers (e.g., anti-reflective layers, photosensitive layers) in lithography methods used to fabricate said devices.

The terms lithography, immersion lithography, photolithography, and optical lithography may be used interchangeably in the present disclosure. Photolithography is a process used in micro-fabrication, such as semiconductor fabrication, to selectively remove parts of a thin film or a substrate. The process can use a radiation to transfer a pattern (e.g., a geometric pattern) from a photomask to a light-sensitive layer (e.g., photoresist, or simply "resist") on the substrate. The radiation causes a chemical change in exposed regions of the photosensitive layer, which may increase or decrease solubility of the exposed regions. If the exposed regions become more soluble, the photosensitive layer is referred to as a positive photoresist. If the exposed regions become less soluble, the photosensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or including material layer formed on a semiconductor substrate), while the patterned photoresist protects regions of the underlying substrate (or material layer). Alternatively, metal deposition, ion implantation, or other processes can be carried out. Finally, an appropriate reagent removes (or strips) the remaining photoresist and the substrate are ready for the whole process to be repeated for the next stage of circuit fabrication. In a complex integrated circuit (for example, a modern CMOS), a substrate may go through the photolithographic cycle a number of times. As described below, while photolithography and the formation of patterning layers are some processes that may benefit from aspects of the present disclosure, other processes provided in semiconductor device fabrication processes such as deposition of insulating layers and conductive layers may also benefit from aspects of the present disclosure.

Beginning now with FIG. 1, illustrated is a flow chart of a method 100 for fabricating a layer on a substrate. The layer may be referred to as a "coating material." In some embodiments, the coating material is formed as a conformal coating over the substrate. In some embodiments, the coating material is selectively deposited. As discussed below, exemplary coating materials may include, but are not limited to, various photosensitive layers, layers of a multi-layer photoresist (e.g., a bottom layer of a tri-layer photoresist), anti-reflective coating layers (e.g., bottom anti-reflective coating (BARC) layers), a hard mask layer, and/or other materials desirable for use in semiconductor device fabrication including but not limited to the embodiments discussed below.

The method 100 begins at block 102 where a substrate is provided that has a first (also referred to as "top") surface. The top surface may be a patterned surface and/or be a substantially planar surface without purposefully-formed typography. In some embodiments, the substrate includes silicon. In a further embodiment, the top surface is silicon in at least some regions. In some embodiment, the substrate includes Germanium (Ge). In a further embodiment, the top surface is germanium in at least some regions. In other embodiments, the substrate may alternatively or additionally include other suitable semiconductor material, such as silicon germanium (SiGe), silicon carbide (SiC), gallium arsenic (GaAs), diamond, indium arsenide (InAs), indium phosphide (InP), silicon germanium carbide (SiGeC), gallium indium phosphide (GaInP), and/or other suitable materials. Thus, in some further embodiments, the top surface, or portion thereof, of the substrate may be any one of suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), gallium indium phosphide (GaInP), and/or or other suitable semiconductor materials.

The top surface of the substrate, as described above, provided in block 102 may include polar groups bonded to the substrate surface. A "polar group" as described herein is a group having an electric dipole or multipole moment. Polar molecules are those that may interact through dipole-dipole intermolecular forces or hydrogen bonds. The polar group may include one or more polarity force functional groups including, but not limited to, hydroxyl (—OH), various amino or amines (—NH$_2$), (—RNH), sulfhydryl (—SH), ester (—RCO$_2$R2), amide (—RC(O)NH$_2$), carboxylic acid functional group (—RC(O)OH), imide functional group (—(RCO)$_2$NR2), carbamate functional group (—OOCNH$_2$), aldehyde functional group (—CHO), or keytone functional group (—RC(=O)R2), where "R", "R2" etc are any substitutes that maintain polarity.

It is noted that the substrate provided in block 102 may also include various features such as various doped regions, shallow trench isolation (STI) regions, source/drain features, gate stacks, dielectric features, and/or multilevel interconnects. Any one of these features may provide a top surface of the substrate or portion of the top surface. These features may similarly provide for a surface having polar functional groups linked thereto. In an embodiment, the top surface of the substrate is a dielectric material such as, for example, a high-k dielectric. The high-k dielectric is an insulating material with a high dielectric constant κ, as compared to silicon dioxide. In an embodiment, the top surface includes TiN, for example, formed to provide a barrier layer in a device formed on the substrate.

Again it is noted that while processing a substrate in the form of a semiconductor wafer may be described, it is to be understood that other examples of substrates and processes may benefit from the present invention such as, for example, printed circuit board substrates, damascene processes, and thin film transistor liquid crystal display (TFT-LCD) substrates and processes.

Figure 3C:
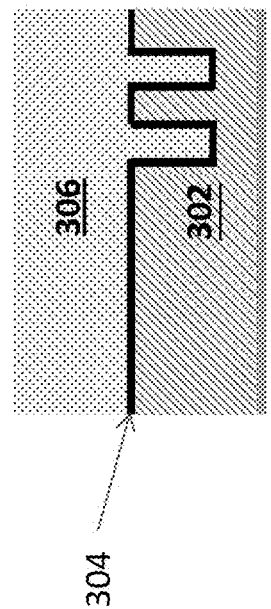
FIGS. 3A, 3B, and 3C are cross-sectional, diagrammatic views of an embodiment processing a semiconductor device according to the steps of FIGS. 1 and/or 2 and one or more aspects of the present disclosure.
Figure 3A:
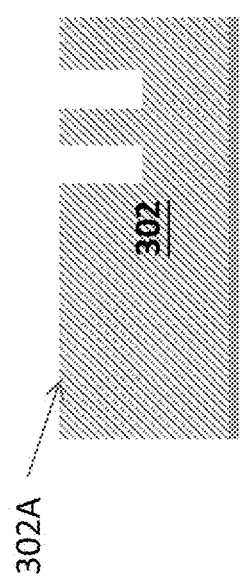

Referring to the example of FIG. 3A, a substrate 302 is provided. The substrate 302 has a top surface 302A. As illustrated in FIG. 3A, the top surface 302A is patterned. However, in other embodiments, the top surface 302A may be substantially planar (e.g., without purposefully patterning). In an embodiment, the substrate 302 includes germanium. In an embodiment, the top surface 302A is germanium. Other examples of compositions for the substrate 302 and/or the top surface 302A include, silicon (Si), silicon germanium (SiGe), silicon carbide (SiC), gallium arsenic (GaAs), diamond, indium arsenide (InAs), indium phosphide (InP), silicon germanium carbide (SiGeC), gallium indium phosphide (GaInP), and/or other suitable semiconductors.

In an embodiment, the top surface 302A has a first composition (e.g., Ge, SiC, InAs, etc) having polar groups bonded thereto. The polar groups may include one or more of, for example, —OH, —NH$_2$, —RNH, —SH, ester, amide, carboxylic acid, imide, carbamate, aldehyde, keyone, and/or other suitable polar groups. In an embodiment, the polar groups bonded to the top surface 302A include a single one type of group selected from —OH group, —NH$_2$ group, —RNH group, —SH group, ester group, amide group, carboxylic acid group, imide group, carbamate group, aldehyde group, keyone group, and/or other suitable polar groups.

In an embodiment, the top surface 302A is germanium, which has hydroxyl functional groups linked thereof. In an embodiment, these functional groups are developed from an oxidation process. The oxidation of the top surface 302A may be performed by exposure to air and/or another suitable oxidation process.

In an embodiment, the top surface 302A is TiN, with a function group attached thereto. Examples of the functional groups attached to nitrogen (N), which provides suitable reactivity through its lone pair of valence electrons.

In an embodiment, the top surface 302A is a high-k dielectric, also with a functional group attached thereto. Example high-k dielectrics include LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), and/or other suitable materials. Examples of the functional groups attached to the high-k dielectric include hydroxyl groups. In an embodiment, an oxide film is formed with an —OH functional group. In an embodiment, a nitride layer, such as Si3N4, is formed with a N-atom lone pair of valence electrons as a functional group.

The substrate surface having the polar groups attached thereto has a contact angle (CA). The contact angle (CA) is an angle, measured through a liquid, where a liquid-vapor interface meets a solid surface. Generally, if a water contact angle is smaller than 90°, the surface is considered hydrophilic and if the water contact angle is larger than 90°, the surface is considered hydrophobic. In an embodiment, the substrate surface having polar groups is hydrophilic. In an embodiment, the substrate surface having polar groups is hydrophobic. As discussed below, the CA, be it hydrophilic or hydrophobic in nature, of the substrate surface with polar groups attached thereto may be relatively incompatible with (or different than) a coating layer that is to be formed thereon. Thus, in the method 100, a surface preparation material may be used to modify (e.g., tune) the CA to a desired value(s) as discussed below. In some embodiments, the surface preparation material modifies the surface from hydrophilic to hydrophobic. In some embodiments, the surface preparation material modifies the surface from hydrophobic to hydrophilic.

The method 100 then proceeds to block 104 where a surface preparation material including an aziridine structure is applied to the top surface of the substrate. In an embodiment, this surface preparation material including an aziridine structure modifies the contact angle of the exposed surface over the substrate as discussed below.

In an embodiment, the surface preparation material is an organic compound including the aziridine structure (functional group), which is a three-membered heterocycle as illustrated below. As the aziridine structure has a 3 atom ring, it may have an ionization energy of approximately 27 mj/mole. This higher ring strain makes it relatively unstable, so it can be reacted (e.g., bonded to) the available substrate surface (e.g., polar group on the semiconductor substrate).

The surface preparation material may be formed on the substrate by spin-on coating, vapor deposition (e.g., chemical vapor deposition, introduction of the material in vapor-form to a given process chamber), and/or other suitable deposition methods. In an embodiment, the surface preparation material includes a solvent, for example, for use in spin-on coating processes. In an embodiment, the surface preparation material may include less than approximately 30 by weight of the material including the arizidine group and the remaining weight percent solvent.

In an embodiment, after it's deposited, the as-deposited surface preparation material may be exposed to an elevated temperature (e.g., baked). For example, in an embodiment, after spin coating, the surface preparation material is baked at a temperature between approximately 60 to approximately 250 degrees Celsius.

As stated above, in an embodiment, the surface preparation material includes a material having an aziridine structure of:

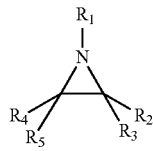

where R1, R2, R3, R4, and R5 may be H, alkyl, alkoxy, aromatic ring, cyclic alkyl, hydroxyl groups, aliphatic hydroxyl, primary, secondary and tertiary amines, carboxylic acids, ketones, aldehydes, esters, glycols, sulfonate, thio group, urea group, nitrile group, cyano group, iso-cyano group with alkyl chain, or other suitable groups. In an embodiment, one or more of R1, R2, R3, R4, and/or R5 are cyclic alkyl having a greater than 20 Carbon atoms. In an embodiment, any one or more of R1, R2, R3, R4, and R5 are the same as one another. In an embodiment, any one or more of R1, R2, R3, R4, and R5 are different than one another. In an embodiment, the aziridine structure (including R1, R2, R3, R4, and R5) may have a molecular weight (Mw) that is less than or approximately equal to 2000.

In an embodiment, R1, R2, R3, R4, and R5 are —H and the material having an aziridine structure 402 is illustrated below:

In an embodiment, at least one of the R1, R2, R3, R4, and R5 groups are provided such that the aziridine structure has a hydrophilic-nature. For example, in an embodiment, one or more of R1, R2, R3, R4, and R5 is provided including a hydroxyl functional group (—OH group). For example, the aziridine structure illustrated with a group R1 as a single carbon having a hydroxyl group (—OH), and R2, R3, R4, and R5 as H, is illustrated below, which is an aziridine structure that has a hydrophilic-nature. In another embodiment, multiple hydroxyl groups are provided.

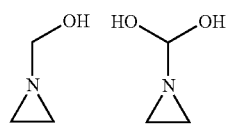 [SMILES: OCN1CC1 ; OC(O)N1CC1]

Use of a surface modification material including the above aziridine structure allows for modification of a surface to which it attaches. In an embodiment, the modification is an increase hydrophilic-nature (e.g., a decrease in contact angle) as discussed below. It should be understood that in other embodiments, any one or more that one of R1, R2, R3, R4, and R5 include hydroxyl groups and the remaining R1, R2, R3, R4, and R5 may be H, alkyl, aromatic ring, or cyclic alkyl groups.

In an embodiment, at least one of the R1, R2, R3, R4, and R5 groups are provided such that the aziridine structure has a hydrophobic-nature. For example, one or more of R1, R2, R3, R4, and R5 groups are alkyl groups. In an embodiment, the material having an aziridine structure is illustrated below, which is an aziridine structure that has a hydrophobic-nature, and R1 is a tert-butyl group.

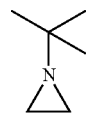

This aziridine structure can allow for modification of a surface to which it attaches. In an embodiment, the modification is an increase in the hydrophobic-nature (e.g., increase the contact angle) as discussed below. It should be understood that while a single alkyl group is shown in the component above, in other embodiments, any one or more that one of R1, R2, R3, R4, and R5 include a tert-butyl of other alkyl group and the remaining R1, R2, R3, R4, and R5 may be H, other alkyl groups, aromatic rings, or cyclic alkyl groups.

The method 100 then proceeds to block 106 where the surface preparation material is linked (e.g., bonded) to the top surface of the substrate. In particular, the material including the aziridine structure provides for the aziridine structure attaching to the polar group on the substrate. For example, the material including the aziridine structure covalent bonds to the polar group by ring opening reaction of the heterocycle.

The bonding of the surface preparation material to the polar group of the substrate may change (e.g., increase or decrease) the contact angle of the substrate top surface based on the configuration of the surface preparation material. This is discussed in further detail with reference to FIG. 2. Depending on the nature of the structure material including the arizidine group, a desired contact angle can be provided by providing the surface preparation material with hydrophilic or hydrophobic structure. For example, providing R1, R2, R3, R4, and/or R5 (in the arizidine structure above) of a suitable component allows for introduction of a hydrophilic structure, hydrophobic structure, and/or provision of a given contact angle. Providing this structure on the surface of the substrate after the arizidine attaches allows for the substrate to exhibit the selected CA, hydrophilic-nature, or hydrophobic-nature. In an embodiment, the R1, R2, R3, R4, and/or R5 (in the arizidine structure above) are determined to be compatible to the nature (CA, hydrophobic, hydrophilic) of an overlying layer such as the layer of block 108 discussed below.

Figure 3B:
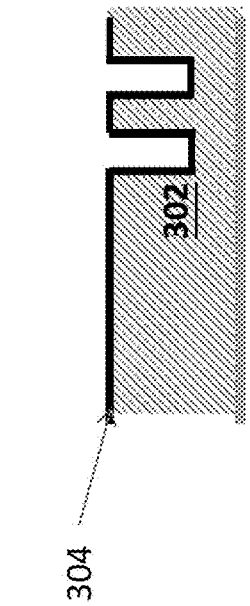

Referring to the example of FIG. 3B, illustrated is a surface preparation material 304 disposed on the substrate 302. The surface preparation material 304 includes an arizidine structure as discussed above. In an embodiment, the thickness of the surface preparation material 304 is approximately 5 nanometers or less.

The method 100 then proceeds to block 108 where a coating material is applied to the modified top surface of the substrate. The coating material may be formed directly on the surface preparation material disposed on the substrate. The coating material may be formed as a blanket layer or selectively deposited. Example depositions include spin-on coating, atomic layer deposition (ALD) techniques, molecular layer deposition (MLD) techniques, chemical vapor deposition (CVD) techniques including, for example, plasma enhanced CVD, and/or other suitable deposition techniques.

In an embodiment, the block 108 involves coating a photoresist over the modified top surface of the substrate having the surface preparation material. In an embodiment, the photoresist is disposed directly onto the surface preparation material. The photoresist may be a positive-type or negative-type resist material and may have a multi-layer structure. The photoresist may utilize a chemical amplification (CA) resist material. For example, the photoresist may be an I-line resist, a DUV resist (krypton fluoride (KrF) resist, an argon fluoride (ArF) resist, an EUV resist, an electron beam (e-beam) resist, and an ion beam resist. In an embodiment, the coating is a radiation sensitive material formed by spin-on coating a liquid polymeric material onto the surface having the surface modification layer. In an embodiment, a multi-layer resist (e.g., a tri-layer resist) is to be formed on the substrate and the coating layer of block 108 is a bottom layer of a tri-layer resist. In an embodiment, the bottom layer of the resist is an organic material such as, for example, a Near Frictionless Carbon (NFC), a diamond-like carbon, or a thermosetting polyarylene ether. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In an embodiment, the material i-line photoresist, for example, a Novolac resin that is prepared by reacting a cresol, xylenol, or other substituted phenols with formaldehyde. In an embodiment, the coating material may be a deep UV photoresist that typically includes polymers having hydroxystyrene groups.

In an embodiment, the block 108 includes depositing an anti-reflective coating on the surface preparation material. Exemplary anti-reflective coatings include a bottom anti-reflective coating materials, high-k materials, silicon oxide, silicon oxygen carbide, silicon oxide deposited by plasma enhanced chemical vapor deposition, and/or other suitable anti-reflective coating materials. In an embodiment, the block 108 includes depositing a hard mask material. Exemplary hard mask materials including organic or inorganic hard mask materials such as amorphous carbon, organo siloxane based materials, SiN, SiON, TiN, and/or other suitable hard mask materials. In an embodiment, the block 108 includes depositing an etch stop layer material. Exemplary etch stop layer materials include silicon nitride, oxynitride, silicon carbide, titanium oxide, titanium nitride, tantalum oxide, tantalum nitride, and/or any suitable materials.

Referring to the example of FIG. 3C, a coating layer 306 is disposed on the surface preparation material 304. As discussed above, the coating layer 306 may include a photosensitive layer, a bottom layer of a multi-layer photoresist, an anti-reflective coating (e.g., BARC), an etch stop layer, and/or other suitable layers.

Additional steps may be implemented before, during, and after the method 100, and some steps described above may be replaced or eliminated for other embodiments of the method 100. For example, the method 100 may continue to provide for deposition of one or more layers on the coating layer. A lithography exposure process may be performed on the coating (e.g., 306), and/or overlying layers. In some embodiments, a lithography exposure process may be of various types as known in the art, including exposure systems that utilize ultraviolet (UV) lithography, deep ultraviolet (DUV) lithography or extreme ultraviolet (EUV) lithography. For example, the radiation source of the lithography system may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; or other light sources having a desired wavelength. In some embodiments, the coating layer (e.g., 306) may be used as a masking element in performing one or more processes on underlying layers such as etching, ion implantation, deposition, and/or other suitable processes including those typical of a CMOS-compatible process. In some embodiments, the coating layer (e.g., 306) is subsequently stripped from the substrate (e.g., 302).

Figure 2:
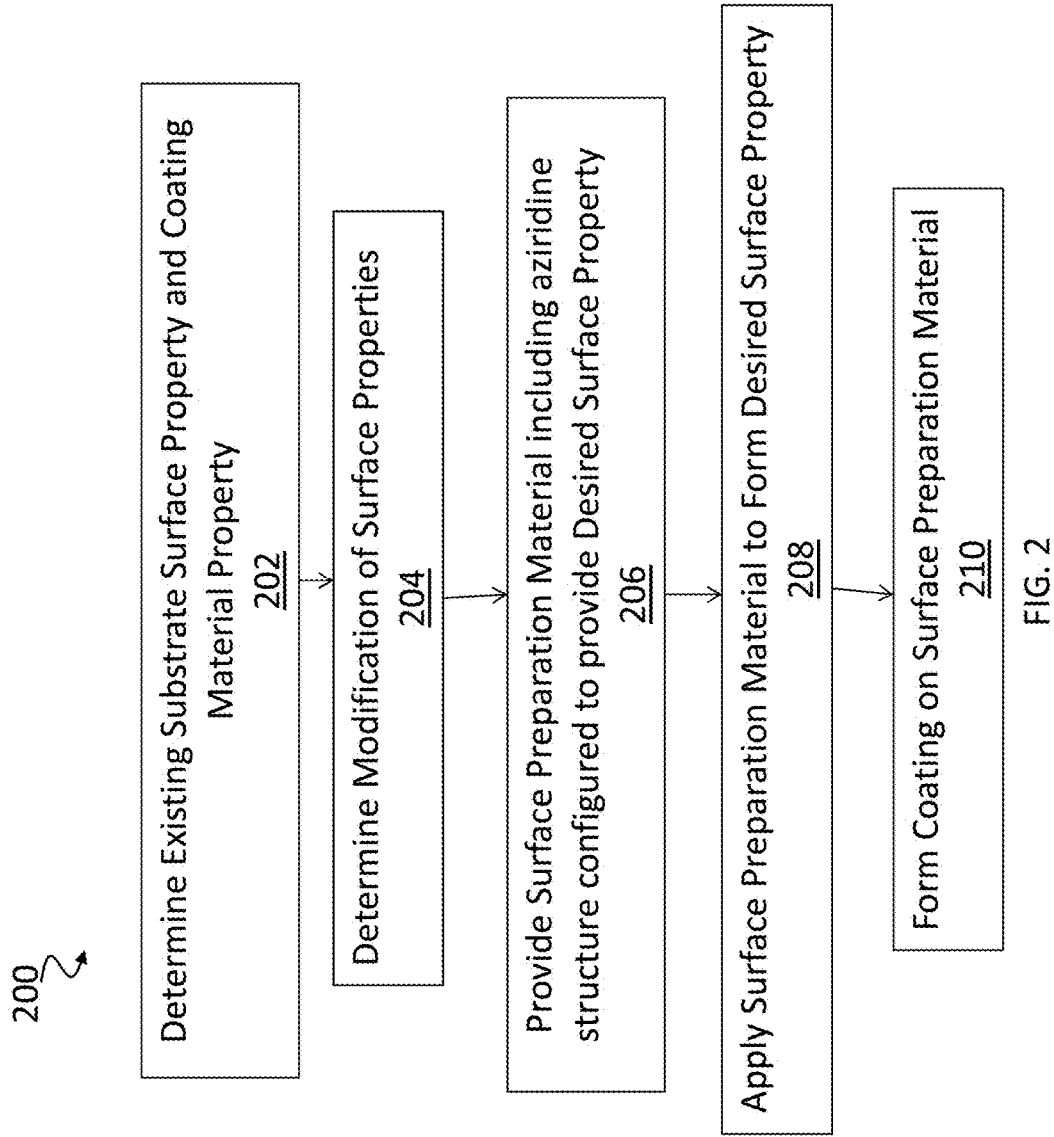
FIG. 2 is a flow chart showing an embodiment of a method of forming a determining a surface material type for applying of over a substrate, according to one or more aspects of the present disclosure.

Referring now to FIG. 2, illustrated is a method 200 for fabricating a semiconductor device including determining a surface preparation material. The method 200 may be used in addition to or in conjunction with the method 100, described above with reference to FIG. 1. In some embodiments, the method 200 is used to determine a configuration of the surface preparation material described above with reference to blocks 104 and 106 of the method 100. For example, the method 200 may be used to determine the aziridine structure of the surface preparation material and in particular determine the components of R1, R2, R3, R4 and/or R5 as illustrated below.

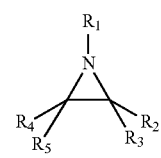

The method 200 begins at block 202 where an existing substrate surface property is determined. The determination may be of an existing contact angle (e.g., with respect to water) or similarly the hydrophobic nature or hydrophilic nature provided by the substrate surface. For example, a "hydrophobic" nature surface is used to describe a surface having a contact angle (CA) that is between greater than about 90°, for example, from 90° and about 150°. Stated another way, the term "hydrophobic surface" may be used to describe a surface that repels or excludes water from the hydrophobic surface. The term "hydrophilic" nature surface is used to describe a surface having a CA that is less than about 90°.

Figure 4B:
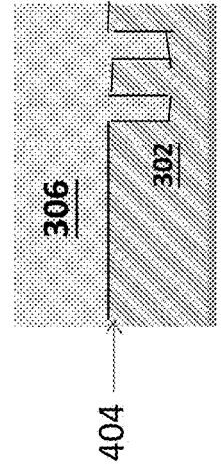
FIGS. 4A, 4B, 4C and 4D are cross-sectional, diagrammatic views of an embodiment processing a semiconductor device according to the steps of FIGS. 1 and/or 2 and one or more aspects of the present disclosure.
Figure 4D:
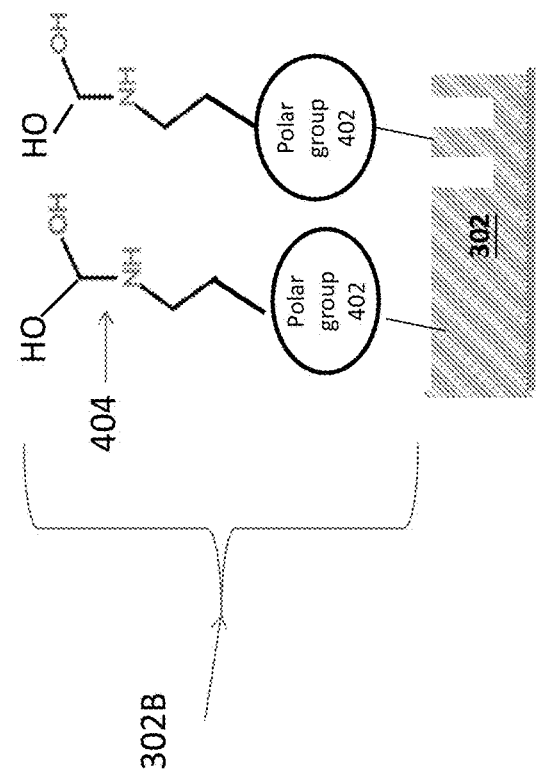
Figure 4A:
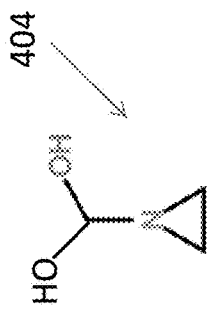

Referring to the example of FIG. 4A, the substrate 302 having a top surface 302A including polar groups 402 is illustrated. In block 202, a surface property (e.g., CA, hydrophobic, hydrophilic nature) of the surface 302A is determined. The polar groups 402 may be —OH, —NH$_2$, —RNH, —SH, —RCO$_2$R2, amide (—RC(O)NH$_2$), carboxylic acid functional group (—RC(O)OH), imide functional group (—(RCO)$_2$NR2), carbamate functional group (—OOCNH$_2$), aldehyde functional group (—CHO), or keytone functional group (—RC(=O)R2), where "R", "R2" etc are any substitutes that maintain polarity. The hydrophobic or hydrophilic nature may be determined by the composition of the top of substrate 302 and/or the functional groups attached thereto.

Block 202 of the method 200 also includes determining the nature or properties of a coating material that is to be applied to the substrate. The coating may be substantially similar to as discussed above in block 108 of the method 100 in FIG. 1. The determination of the nature of the coating may include determining its hydrophilic nature, its hydrophobic nature, or a contact angle. For example, in an embodiment, it is determined that the coating is a hydrophilic BARC material. In a further embodiment, the CA of the coating (e.g., hydrophilic BARC) material is determined.

The method 200 then proceeds to block 204 where a desired modification of the surface properties of the substrate is determined. In accordance with some embodiments of the present disclosure, a surface of the target substrate is treated to render it more hydrophilic by the application of the surface modification material before applying a material coating (e.g., a hydrophilic material coating). For example, in an embodiment the surface of the target substrate is transformed from hydrophobic to hydrophilic by the application of the surface modification material before applying a hydrophilic material coating. In accordance with some embodiments of the present disclosure, a surface of the target substrate is treated to be more hydrophobic by the application of the surface modification material before applying a material coating (e.g., hydrophobic material coating). For example, in an embodiment the surface of the target substrate is transformed from hydrophilic to hydrophobic by the application of the surface modification material before applying a hydrophobic material coating.

The modification may additionally or alternatively be determined as a desired reduction in the CA bias (e.g., difference) between the substrate surface and the to-be deposited coating material. For example, in an embodiment a desired CA of approximately 20° for the substrate is determined in order to align properties of the modified surface with a coating layer of hydrophilic material that is to be deposited on the substrate. In an embodiment, the CA of the substrate (e.g., having polar groups) prior to the surface modification material deposition is greater than approximately 20°. Thus, the CA bias between the substrate and the coating material is desired to be decreased. In an embodiment, it is desired to decrease the CA bias (e.g., difference) between the substrate to less than approximately 10°.

After determining the desired modification of the surface properties of the substrate, the method 200 then proceeds to block 206 where a surface preparation material including an aziridine structure is configured to provide the desired modification. The surface preparation material may be substantially similar to as discussed above with reference to block 104 of the method 100. An aziridine structure of the surface preparation material is determined by determining, selecting, and providing components of R1, R2, R3, R4 and/or R5 as illustrated in the aziridine structure below.

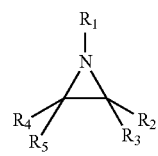

In an embodiment, one or more of R1, R2, R3, R4 and/or R5 are selected to provide a hydrophobic nature of the surface preparation material. In a further embodiment, this hydrophobic nature provides for increasing the CA of the substrate surface. In an embodiment, one or more of R1, R2, R3, R4 and/or R5 are selected to provide a hydrophilic nature of the surface preparation material. In a further embodiment, this hydrophilic nature provides for decreasing the CA of the substrate surface. Example groups for R1, R2, R3, R4 and/or R5 that provide hydrophobic properties include alkyl groups, alkoxy, aromatic ring, cyclic alkyl and/or other suitable hydrophobic functional groups. Example groups for R1, R2, R3, R4 and/or R5 that provide hydrophilic properties include hydroxyl groups, hydroxyl groups, aliphatic hydroxyl groups, primary, secondary and tertiary amines, carboxylic acids, ketones, aldehydes, esters, glycols, sulfonate, thio groups, urea groups, nitrile groups, cyano groups, iso-cyano groups with alkyl chain, and/or other hydrophilic groups.

Referring to the example of FIG. 4B, a surface preparation material 404 is illustrated. The surface preparation material 404 may be substantially similar to the surface preparation material discussed above with reference to block 104 of the method 100. The surface preparation material 404 is an aziridine structure having hydroxyl groups. The surface preparation material 404 may serve to reduce the CA of the substrate surface 302A, for example, increasing the hydrophilic nature. As discussed above, the surface preparation material 404 may include other functional groups for R1, R2, R3, R4, and R5 providing one or more of said groups including a hydroxyl group.

The method 200 then proceeds to block 208 where the surface preparation material is applied onto the substrate. The surface preparation material may be applied using vapor deposition, spin-on coating, and/or other suitable deposition method. Block 208 may be substantially similar to blocks 104 and/or 106 of the method 100, described above with reference to FIG. 1.

Figure 4C:
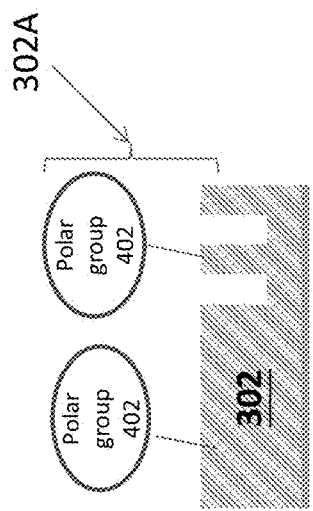

Referring to the example of FIG. 4C, the surface preparation material 402 is provided to the substrate 302. The surface preparation material 402 bonds to the polar group 402 of the top surface of the substrate 302A (FIG. 4A) forming modified surface 302B. When covalently bonding to the polar group 402, the ring of the aziridine structure opens. The modified surface 302B may have a modified hydrophilic/hydrophobic property as compared to the surface 302A. The nature of the surface 302B is dependent upon the functional groups attached to the aziridine structure.

As illustrated in the embodiment of FIG. 4C, the arizidine structure provides a top surface 302B having a plurality of hydroxyl groups. This can provide a more hydrophilic surface property than that of 302A prior to the application of the surface preparation material. In an embodiment, the top surface 302A is hydrophobic and the top surface 302B is hydrophilic. In an embodiment, the CA of the substrate surface 302A is decreased to provide the surface 302B having a CA of approximately 20° when the surface material is attached.

The method 200 then proceeds to block 210 where the coating material is provided onto the surface modification material. Block 210 may be substantially similar to block 108 of the method 100, described above with reference to FIG. 1. Referring to the example of FIG. 4D, the coating material 306 is applied to the substrate 302. The coating material 306 may be hydrophilic. In an embodiment, the contact angle of the coating material 306 is substantially similar to the contact angle provided by the top surface 302B of the surface preparation material 402. In an embodiment, the contact angle of the coating material 306 is within 10 degrees of the contact angle provided by the top surface 302B of the surface preparation material 402.

In some embodiments, the coating material 308 is disposed on the substrate 302 without voiding and/or without adhesion issues. In some embodiments, this quality coating is provided because of the match of the hydrophobic/hydrophilic nature of the the coating material 308 and the surface 302B provided by the introduction of the surface preparation material 402.

The present disclosure provides many different embodiments of fabricating a layer of a semiconductor device that provide one or more improvements over existing approaches. Benefits of some embodiments include allowing for a coating layer to be formed onto the substrate without voiding and with proper adhesion. Certain embodiments provide providing a substrate with similar properties (e.g., hydrophobic, hydrophilic nature) as a coating layer to be disposed thereon. In doing so, adhesion and suitable coating coverage may be provided in certain embodiments.

Thus, in one of the broader embodiments, a method is provided that describes providing a semiconductor substrate. A surface preparation material is applied including an aziridine structure to the semiconductor substrate to provide a treated surface. A layer is formed over the treated surface.

In another embodiment, a method is provided that includes providing a semiconductor substrate having a surface. The surface is one of a hydrophobic nature and a hydrophilic nature. A surface preparation material is applied to the surface, the surface preparation material including an aziridine structure. The applying the surface preparation material transforms the surface to the other one of the hydrophilic nature and the hydrophilic nature. A coating material is then formed over the treated surface. The coating material also has the other on the hydrophilic nature and the hydrophilic nature.

In another of the broader embodiments, a device is provided that includes a semiconductor substrate; an aziridine material disposed on the semiconductor substrate; and a coating layer on the aziridine material.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
providing a semiconductor substrate having a surface, wherein the surface has a first contact angle with respect to water;
covalently attaching a surface preparation material to the semiconductor substrate to provide a treated surface, wherein the surface preparation material includes an aziridine compound, and wherein the treated surface has a second contact angle with respect to water that is different from the first contact angle; and
forming a layer over the treated surface, the layer having a third contact angle with respect to water, wherein the third contact angle is substantially different from the first contact angle and substantially similar to the second contact angle.

2. The method of claim 1, wherein the surface of the semiconductor substrate includes a plurality of polar groups attached thereto.

3. The method of claim 1, wherein the covalently attaching of the surface preparation material includes spin coating the surface preparation material including the aziridine compound and a solvent.

4. The method of claim 1, wherein the covalently attaching of the surface preparation material includes vapor deposition of the surface preparation material including the aziridine compound.

5. The method of claim 1, further comprising:
baking the semiconductor substrate having the treated surface prior to forming the layer.

6. The method of claim 1, the aziridine compound having a structure of

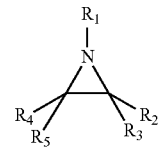

wherein R1, R2, R3, R4, and R5 are independently selected from H, alkyl, alkoxy, aromatic ring, cyclic alkyl, hydroxyl groups, aliphatic hydroxyl, primary, secondary and tertiary amines, carboxylic acids, ketones, aldehydes, esters, glycols, sulfonate, thio group, urea group, nitrile group, cyano group, and iso-cyano group with alkyl chain, and wherein R1, R2, R3, R4, and R5 are the same or different.

7. The method of claim 1, wherein a difference between the second contact angle and the third contact angle is less than or equal to 10 degrees.

8. The method of claim 1, further comprising, prior to covalently attaching the surface preparation material:
determining the third contact angle of a material used to form the layer; and
using the third contact angle to select the aziridine compound.

9. A method comprising:
providing a semiconductor substrate having a surface;
determining a first contact angle of the surface of the semiconductor substrate with respect to water;
determining a second contact angle of a coating material with respect to water;
selecting a surface preparation material based on a difference between the first contact angle and the second contact angle, wherein the surface preparation material has a third contact angle with respect to water;
applying the surface preparation material to the surface of the semiconductor substrate to provide a treated surface, the surface preparation material including an aziridine compound having a structure of:

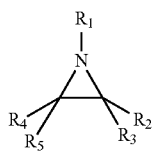

wherein R1, R2, R3, R4, and R5 are independently selected from H, alkyl, alkoxy, aromatic ring, cyclic alkyl, hydroxyl groups, aliphatic hydroxyl, primary, secondary and tertiary amines, carboxylic acids, ketones, aldehydes, esters, glycols, sulfonate, thio group, urea group, nitrile group, cyano group, and iso-cyano group with alkyl chain, and wherein R1, R2, R3, R4, and R5 are the same or different; and
applying the coating material over the treated surface.

10. The method of claim 9, wherein the applying of the coating material includes forming a bottom anti-reflective coating.

11. The method of claim 9, wherein the applying of the coating material includes forming a photoresist material.

12. The method of claim 9, further comprising:
baking the semiconductor substrate having the surface preparation material prior to forming the coating material.

13. The method of claim 9, wherein the applying of the coating material includes depositing the coating material directly on the surface preparation material.

14. The method of claim 9, wherein when the first contact angle of the surface of the semiconductor substrate prior to applying the surface preparation material is greater than about 90°, the surface preparation material is determined to be substantially hydrophilic in nature.

15. The method of claim 14, wherein the aziridine compound includes a hydroxyl functional group.

16. The method of claim 9, wherein when the first contact angle of the surface of the semiconductor substrate prior to applying the surface preparation material is less than about 90°, the surface preparation material is determined to be substantially hydrophobic in nature.

17. The method of claim 16, wherein the aziridine compound includes an alkyl functional group.

18. A method, comprising:
providing a semiconductor substrate having a top surface with a plurality of polar groups;
measuring a first contact angle of the top surface;
subsequent to measuring the first contact angle, covalently attaching a surface preparation material including an aziridine compound to the top surface of the semiconductor substrate to provide a treated surface, wherein the treated surface has a second contact angle;
measuring a third contact angle of a coating material; and
subsequent to measuring the third contact angle, depositing a layer of the coating material over the treated surface, wherein a difference between the first contact angle and the second contact angle is greater than a difference between the first contact angle and the third contact angle.

19. The method of claim 18, wherein the plurality of polar groups include at least one of an —OH group, a —NH$_2$ group, a —RNH group, a —SH group, an ester group, an amide group, a carboxylic acid group, an imide group, a carbamate group, an aldehyde group, and a ketone group.

20. The method of claim 18, wherein the top surface has a hydrophilic nature prior to the covalently attaching of the surface preparation material and a hydrophobic nature after the covalently attaching of the surface preparation material.

* * * * *